United States Patent [19]

Ikegami

[11] Patent Number: 5,383,158

[45] Date of Patent: Jan. 17, 1995

[54] SEMICONDUCTOR MEMORY DEVICE EQUIPPED WITH DISCHARGING UNIT FOR BIT LINES ACCESSED WITH INVALID ADDRESS

[75] Inventor: Fumio Ikegami, Tokyo, Japan

[73] Assignee: NEC Corporation, Tokyo, Japan

[21] Appl. No.: 131,937

[22] Filed: Oct. 5, 1993

Related U.S. Application Data

[63] Continuation of Ser. No. 706,710, May 28, 1991, abandoned.

[30] Foreign Application Priority Data

May 28, 1990 [JP] Japan .................. 2-137376

[51] Int. Cl.6 .................. G11C 8/00; G11C 7/00
[52] U.S. Cl. .................. 365/230.01; 365/230.03; 365/230.06; 365/230.08; 365/203
[58] Field of Search .................. 365/189.04, 189.05, 365/190, 203, 208, 154, 230.06, 204, 230.01, 230.03, 230.08

[56] References Cited

U.S. PATENT DOCUMENTS

| | | | |
|---|---|---|---|
| 4,730,279 | 3/1988 | Ohtani | 365/203 |
| 4,821,235 | 4/1989 | Heald | 365/154 |
| 4,866,677 | 9/1989 | Sakurai | 365/189.04 |
| 4,953,127 | 8/1990 | Nagahashi et al. | 365/189.05 |
| 4,984,204 | 1/1991 | Sato et al. | 365/208 |
| 5,124,947 | 6/1992 | Nakada | 365/190 |

Primary Examiner—Timothy P. Callahan
Assistant Examiner—Trong Phan
Attorney, Agent, or Firm—Sughrue, Mion, Zinn, Macpeak & Seas

[57] ABSTRACT

A static random access memory device is usually equipped with an address decoder having unused output nodes, and an external address signal designating one of the unused output nodes causes output data paths to be kept in a precharged state and, accordingly, feed-through current to flow through output data drivers, because only small differential voltage is left between the precharging voltage level and the threshold level of the component transistors of the output data drivers, wherein a switching circuit allows the output data paths to couple with either high or low voltage source upon selection of one of the unused output nodes so as to protect the output data paths against the feed-through current.

11 Claims, 3 Drawing Sheets

SEMICONDUCTOR MEMORY DEVICE EQUIPPED WITH DISCHARGING UNIT FOR BIT LINES ACCESSED WITH INVALID ADDRESS

This is a continuation of application Ser. No. 07/706,710 filed May 28, 1991, now abandoned.

FIELD OF THE INVENTION

This invention relates to a semiconductor memory device and, more particularly, to a discharging unit incorporated in a static type random access memory device for supplying a constant voltage level to bit lines if no word line is designated by row address bits.

DESCRIPTION OF THE RELATED ART

A typical example of the static random access memory cell incorporated in the static type random access memory device is illustrated in FIG. 1 and designated by reference M11. The memory cell M11 is implemented by two inverting circuits INV1 and INV2 coupled in such a manner to form a loop of data path. The memory cell M11 is associated with a pair of write-in data lines WD11 and WD12, and the write-in data lines WD11 and WD12 are coupled through two series combinations of n-channel type field effect transistors Qn1, Qn2, Qn3 and Qn4 to the input nodes of the inverting circuits INV1 and INV2, respectively. The memory cell M11 is further associated with a series combination of an inverting circuit INV3 and an n-channel type field effect transistor Qn5 coupled between the memory cell 1 and a read-out data line RD1. The n-channel type field effect transistors Qn1, Qn2 and Qn5 are concurrently gated by a word line W1, and the n-channel type field effect transistors Qn3 and Qn4 concurrently turn on and off with a write-in control signal WCL.

Although a large number of static random access memory cells M11 to Mmn are arranged in matrix, only one of the static random access memory cells is shown in FIG. 1, because the other static random access memory cells are similar to the static random access memory cell 1. The other static random access memory cells M21 to Mmn are assumed to be associated with word lines W2 to Wm, pairs of write-in data lines WD21 and WD22 to WDn1 and WDn2 and read-out data lines RD2 to RDn.

If an address signal designates the memory cell M11 for a read-out operation, the word line W1 is driven to an active high level by a row address decoder (not shown), and the n-channel type field effect transistor Qn5 turns on for transferring a data bit from the inverting circuit INV3 to the read-out data line RD1. Namely, the read-out data line RD1 has been precharged to an intermediate voltage level Vcc/2, and the inverting circuit INV3 drives the read-out data line RD1 to either high or low level depending upon the data bit memorized in the accessed memory cell M11, and either high or low level indicative of the data bit is propagated to, for example, an inverting circuit for an output data bit. However, the write-in control signal WCL remains low, and the write-in data lines WD11 and WD12 are not conducted to the memory cell M11. Therefore, the data bit stored in the memory cell M11 is unchanged.

In order to rewrite the data bit stored in the memory cell M11, the address signal allows the row address decoder to drive the word line W1 to the active high level again, and the write-in control signal WCL goes up to the high level. The n-channel type field effect transistors Qn1 and Qn2 turn on in the presence of the active high level on the word line W1, and the n-channel type field effect transistors Qn3 and Qn4 also turn on in the presence of the write-in control signal of the high level. Then, the write-in data lines WD11 and WD12 are conducted to the input nodes of the inverting circuits INV1 and INV2, and a new data bit on the write-in data lines WD11 and WD12 is written into the memory cell M11. The circuit behavior of another memory cell is similar to that of the memory cell M11.

The prior art static type random access memory device thus arranged suffers from feed-through current, and, accordingly, current consumption tends to be increased due to the feed-through current. In detail, the word lines W1 to Wm are coupled to the m-output nodes of the row address decoder unit, and the row address decoder unit usually has more than m output nodes. If the address signal designates one of the m output nodes, the word line coupled to the selected output node is driven to the high level, and no problem takes place. However, if an output node except for the m output nodes is designated by the address signal, all of the word lines remain in the inactive low level, and no memory cell is coupled to the read-out data lines RD1 to RDn. Since the read-out data lines RD1 to RDn have been already precharged to the intermediate level Vcc/2, all of the inverting circuits for the output data bit are supplied at the input nodes thereof with the intermediate level Vcc/2. The intermediate level Vcc/2 thus supplied to all of the inverting circuits for the output data bit causes the p-channel type component transistor and the n-channel type component transistor of each inverting circuit concurrently turn on due to, for example, undesirable noises, because small differences are left between the intermediate level Vcc/2 and the threshold levels of the component transistors. The concurrent on-states of the component transistors allow feed-through current to pass therethrough, and the feed-through current deteriorates the current consumption of the static type random access memory device.

SUMMARY OF THE INVENTION

It is therefore an important object of the present invention to provide a semiconductor memory device in which any feed-through current hardly flows even if an address signal designates an unused output node of a row address decoder unit.

To accomplish the object, the present invention proposes to shift read-out data paths to either high or low level when an unused output node is selected by an external address signal.

In accordance with one aspect of the present invention, there is provided a semiconductor memory device comprising a) a plurality of memory cells arranged in rows and columns and storing data bits, b) a plurality of word lines respectively associated with the rows of the memory cells and selectively driven to an active level for selecting one of the rows of the memory cells, c) a plurality of read-out data paths connectable with the aforesaid one of the rows of the memory cells for propagating the data bits read out therefrom, d) a plurality of circuits respectively coupled to the plurality of read-out data paths and responsive to the data bits on the associated plurality of read-out data paths, e) a switching circuit responsive to a control signal for coupling the plurality of read-out data paths to a source of constant voltage level indicative of either logic level, and f) a row address decoder unit responsive to a row address signal for selectively driving the word lines or for producing the control signal, the row address decoder unit having first output nodes respectively coupled to the plurality of word lines and at least one second output node where the control signal takes place.

In accordance with another aspect of the present invention, there is provided a semiconductor memory device comprising a) a plurality of memory cells arranged in rows and columns and storing data bits, b) a plurality of word lines associated with the rows of the memory cells, respectively, and selectively driven to an active level by a row address decoder unit for selecting one of the rows of the memory cells, c) a plurality of read-out data paths connectable with the aforesaid one of the rows of the memory cells for propagating the data bits read out therefrom, d) a column selecting unit responsive to a column selecting signal for coupling one of the plurality of read-out data paths to an output data path, an electric circuit being responsive to an output data on the output data path, f) a switching circuit responsive to a control signal for coupling the output data path to a source of constant voltage level indicative of either logic level, and g) a column address decoder unit responsive to a column address signal for producing one of the column selecting signal and the control signal, the column address decoder unit having first output nodes coupled to the column selecting unit for supplying the column selecting signal, and at least one second output node coupled to the switching circuit for supplying the control signal.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
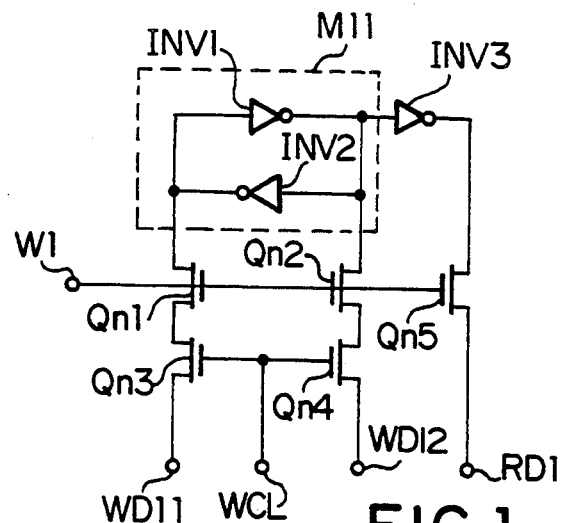
FIG. 1 is a circuit diagram showing the prior art static type random access memory cell associated with the write-in and read-out data lines.
Figure 2:
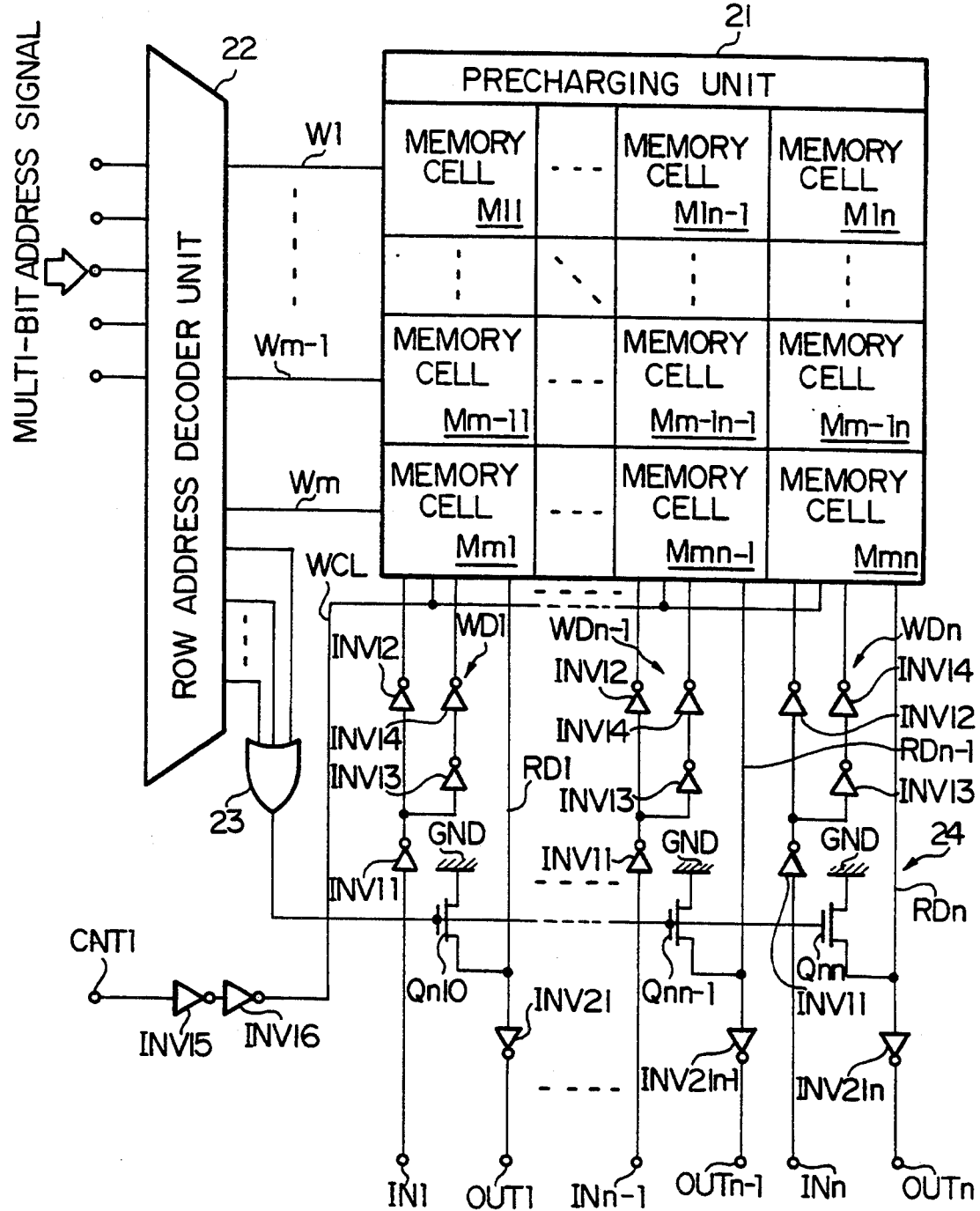
FIG. 2 is a circuit diagram showing the arrangement of a static type random access memory device according to the present invention.

Referring to FIG. 2 of the drawings, a static type random access memory device embodying the present invention comprises a plurality of memory cells M11, M1n-1, M1n, Mm-11, Mm-1n-1, Mm-1n, Mm1, Mmn-1 and Mmn arranged in matrix. Each of the memory cells M11 to Mmn and associated switching transistors are similar in arrangement to the static random access memory cell M11 shown in FIG. 1, and no further description is incorporated hereinbelow.

The rows of the memory cells M11 to Mmn are respectively coupled to word lines W1, Wm-1 and Wm, and the columns of the memory cells M11 to Mmn are associated with a plurality of read-out data lines RD1, RDn-1 and RDn and a plurality of write-in data pairs WD1, WDn-1 and WDn. The memory cells M11 to Mmn selectively enter a read-out mode operation and a write-in mode of operation, and a write control signal line WCL is provided for the selection.

The static type random access memory device is equipped with a plurality of input data terminals IN1, INn-1 and INn each coupled through inverting circuits INV11, INV12, INV13 and INV14 to the associated write-in data line pair WD1, WDn-1 or WDn. Since difference is introduced between the numbers of the inverting circuits coupled to the component write-in data lines of the associated write-in data line pair WD1, WDn-1 or WDn, the inverting circuits INV11 to INV14 produce write-in data signals complementary to each other on the basis of one of the input data bits supplied to the associated input data terminal IN1, INn-1 or INn. As described in connection with the memory cell M11 shown in FIG. 1, the input data bits are propagated to a row of the memory cells M11 to M1n, Mm-11 to Mm-1n or Mm1 to Mmn in the presence of a write-in control signal on the write-in control signal line WCL indicative of the write-in mode of operation. The write-in control signal is supplied from an external device through a control terminal CNT1 and inverting circuits INV15 and INV16 to the write-in control line WCL.

The read-out data lines RD1 to RDn are also connectable with a row of the memory cells M11 to M1n, Mm-11 to Mm-1n or Mm1 to Mmn, and are coupled to a precharging unit 21. The precharging unit 21 concurrently precharges all of the read-out data lines RD1 to RDn to an intermediate voltage level Vcc/2 before data bits are read out from a row of the memory cells M11 to M1n, Mm-11 to Mm-1n or Mm1 to Mmn. The read-out data lines RD1 to RDn are respectively coupled at the opposite ends to the precharging unit 21 with output inverting circuits INV21, INV21n-1 and INV21n which further serve as output driver circuits. In this instance, each of the output inverting circuits INV21 to INV21n is implemented by a series combination of a p-channel type field effect transistor and an n-channel type field effect transistor, and the associated read-out data line RD1, RDn-1 or RDn is coupled to the gate electrode of the p-channel type field effect transistor as well as the gate electrode of the n-channel type field effect transistor. The output inverting circuits INV21 to INV21n in turn are coupled to output data terminals OUT1, OUTn-1 and OUTn.

The word lines W1 to Wm are respectively coupled to m output nodes of a row address decoder unit 22. However, the row address decoder unit 22 decodes a multi-bit address signal into more than m bits, and, therefore, unused output nodes are left and coupled to an OR gate 23. The output node of the OR gate 23 is coupled to a switching circuit 24 which comprises a plurality of n-channel type field effect transistors Qn10, Qnn-1 and Qnn coupled between a ground voltage line GND and the read-out data lines RD1 to RDn. The n-channel type field effect transistors Qn10 to Qnn are concurrently gated by the OR gate 23 and supplies the ground voltage level to the read-out data lines RD1 to RDn.

Description is hereinbelow made on the circuit behavior of the static type random access memory device shown in FIG. 2. A write-in mode of operation is similar to that of the prior art random access memory device, and, for this reason, description is omitted.

If the static type random access memory device enters the read-out mode of operation, the write-in control signal remains inactive low, and the write-in data line pairs WD1 to WDn are isolated from the memory cells M11 to Mmn. Assuming now that the multi-bit address signal designates the word line W1, the row address decoder unit 22 drives the word line W1 to the active high level, and the memory cells M11 to M1n are conducted to the associated read-out data lines RD1 to RDn, respectively. The precharging unit 21 has already precharged the read-out data lines RD1 to RDn to the intermediate level Vcc/2, and the read-out data lines RD1 to RDn go up to the power voltage level Vcc or down to the ground voltage level depending upon the data bits read out from the memory cells M11 to Mmn. In this instance, if a data bit is logic "1" level, the read-out data line goes up to the power voltage level Vcc; however, a data bit of logic "0" level allows going down to the ground voltage level. Since all of the unused output nodes of the row address decoder unit 22 remain inactive low, the OR gate 23 keeps the gate electrodes of the n-channel type field effect transistors Qn10 to Qnn in the ground voltage level, and the read-out data lines RD1 to RDn do not conduct to the ground voltage line GND. The data bits read out from the memory cells M11 to M1n complementarily shifts the component field effect transistors of the associated output inverting circuits INV21 to INV21n, and the output inverting circuits INV21 to INV21n supply output data signals respectively indicative of the data bits to the output data terminals OUT1 to OUTn.

However, if the multi-bit address signal designates one of the unused output nodes, all of the word lines W1 to Wm remain inactive low, and the read-out data lines RD1 to RDn are kept in the intermediate level Vcc/2. However, one of the unused output nodes allows the OR gate 23 to supply the power voltage level Vcc to the gate electrodes of the n-channel type field effect transistors Qn10 to Qnn, and the n-channel type field effect transistors Qn10 to Qnn concurrently turn on so that the read-out data lines RD1 to RDn are conducted to the ground voltage line GND. Then, the read-out data lines RD1 to RDn are discharged to the ground voltage level, and no feed-through current flows through the output inverting circuits INV21 to INV21n, because the ground voltage level on the read-out data lines RD1 to RDn are large enough to keep one of the component field effect transistors of each output inverting circuit off. Moreover, the ground voltage level on the read-out data lines RD1 to RDn is less causative of damages of the component field effect transistors.

Second Embodiment

Figure 3:
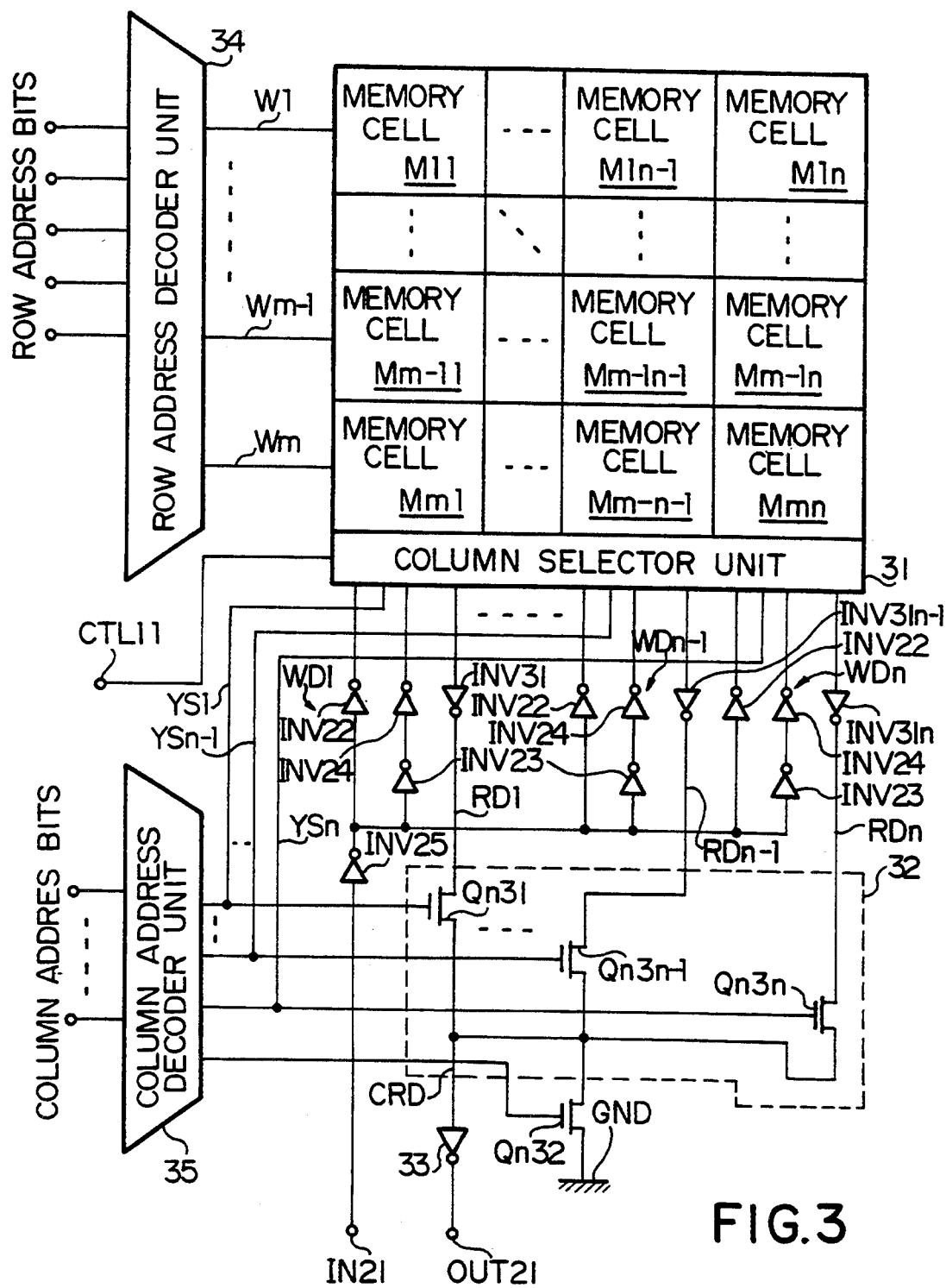
FIG. 3 is a circuit diagram showing the arrangement of another static random access memory device according to the present invention.

Turning to FIG. 3 of the drawings, another static type random access memory device is illustrated and comprises a plurality of memory cells M11 to Mmn arranged in rows and columns. The memory cells M11 to Mmn and associated switching transistors (not shown) are similar in arrangement to that shown in FIG. 1, and are associated with a plurality of write-in data pairs WD1 to WDn each associated with inverting circuits INV22 to INV24, a plurality of read-out data lines RD1 to RDn respectively associated with the inverting circuits INV31 to INV31n and a plurality of word lines W1 to Wm. However, an input data terminal IN21 is coupled through an inverting circuit INV25 to the inverting circuits INV22 and INV23 associated with each write-in data line pair so that an input data bit is supplied to all of the write-in data line pairs WD1 to WDn in the form of write-in data signals complementary to each other. The write-in data line pairs WD1 to WDn are divided into two sections by a first column selector unit 31, and the output inverting circuits INV31 to INV31n are coupled through a second column selector unit 32 as well as a common read-out data line CRD to an output driver circuit 33. The output driver circuit 33 in turn is coupled to an output data terminal OUT21.

The word lines W1, Wm-1 and Wm are selectively driven by a row address decoder unit 34, and the first and second column selector units 31 and 32 are associated with a column address decoder unit 35. The column address decoder unit 35 is coupled through bifurcated column selecting lines YS1, YSn-1 and YSn to the first and second column selector units 31 and 32, and allows the first and second column selector units 31 and 32 to propagate input and output data bits to a column of the memory cells and the output driver circuit 33, respectively. The second column selector unit 32 is implemented by n-channel type transfer gate transistors Qn31, Qn3n-1 and Qn3n coupled between the read-out data lines RD1 to RDn to the output driver circuit 33. The output driver circuit 33 may be implemented by a series combination of a p-channel type field effect transistor and an n-channel type field effect transistor (not shown in FIG. 3), and the common read-out data line CRD is coupled to the gate electrode of the p-channel type field effect transistor and the gate electrode of the n-channel type field effect transistor. Though not shown in the circuit diagram, the first column selector unit 31 has the similar arrangement to the second column selector unit 32.

In this instance, the column address decoder unit 35 decodes column address bits into more than n outputs, and an unused output node is left. The unused output node is coupled to the gate electrode of an n-channel type field effect transistor Qn32, and the n-channel type field effect transistor Qn32 is coupled between the n-channel type transfer gate transistors Qn31 to Qn3n and a ground voltage line GND. The n-channel type field effect transistor Qn32 serves as a switching circuit. The static type random access memory device thus arranged selectively enters a write-in mode of operation and a read-out mode of operation depending upon a write-in control signal supplied to a control terminal CTL11.

Description is hereinbelow made on the circuit behavior on the assumption that the memory cell M11 is selected from the memory cell array. If the static type random access memory device enters the write-in mode of operation. An input data bit is distributed to all of the write-in data pairs WD1 to WDn, and the first column selector unit 31 transfers the input data bit in the form of the complementary signals to the leftmost column of the memory cells M11 to Mm1 designated by the column address decoder unit 35. The row address decoder unit 34 drives the word line W1 to the active high level, and the input data bit is memorized in the memory cell M11.

If the static type random access memory device enters the read-out mode of operation, the uppermost row of the memory cells M11 to M1n provides data bits to the associated read-out data lines RD1 to RDn, and the column address decoder unit 35 allows the second column address decoder unit 32 to interconnect the output inverting circuit INV22 to the output driver circuit 33. The common read-out data line CRD has been precharged to an intermediate voltage level Vcc/2, and the common read-out data line CRD is driven to the power voltage level or the ground voltage level depending upon the logic level of the data bit read out from the memory cell M11. The output driver circuit 33 allows one of the component field effect transistor to turn on and the other component transistor to turn off depending upon the voltage level on the common read-out data line CRD. As a result, an output signal indicative of the data bit memorized in the memory cell M11 is supplied to the output data terminal OUT21.

However, if the column address bits designate the unused output node, the common read-out data line CRD is isolated from the output inverting circuits INV31 to INV31n, and keeps the intermediate voltage level Vcc/2. Since the unused output node is coupled to the gate electrode of the n-channel type field effect transistor Qn32, the n-channel type field effect transistor Qn32 turns on to discharge the intermediate voltage level Vcc/2 to the ground voltage line. Thus, the common read-out data line CRD goes down to the ground voltage level, and provides a differential voltage large enough to keep one of the component field effect transistors of the output driver circuit 33.

Figure 4:
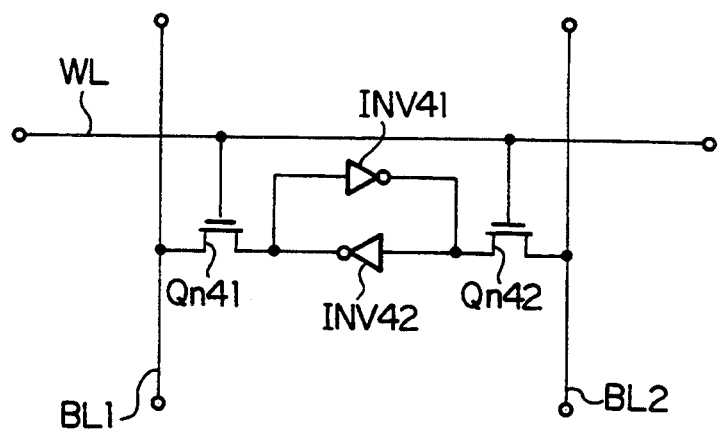
FIG. 4 is a circuit diagram showing the arrangement of another static type random access memory cell.

Although particular embodiments of the present invention have been shown and described, it will be obvious to those skilled in the art that various changes and modifications may be made without departing from the spirit and scope of the present invention. In the aforementioned embodiments, the ground voltage level is indicative of logic "0" level; however, the ground voltage level may be indicative of logic "1" level, and the ground voltage level may be replaced with a power voltage level Vcc indicative of either logic level. Moreover, the memory cells incorporated in the static random access memory device according to the present invention may be implemented by a combination of two inverting circuits INV41 and INV42 and two n-channel type switching transistors Qn41 and Qn42 as shown in FIG. 4. In this instance, the n-channel type switching transistors Qn41 and Qn42 are gated by a word line WL, and interconnect the inverting circuits INV41 and INV42 to a pair of bit lines BL1 and BL2. In order to prevent output driver circuits from feed-through current, an unused output node of an address decoder unit allows the bit lines to couple with a constant voltage level. Furthermore, the present invention may appertain to another kind of semiconductor memory device such as, for example, a dynamic type random access memory device.

What is claimed is:

1. A semiconductor memory device comprising
   a) a plurality of memory cells arranged in rows and columns and storing data bits,
   b) a plurality of word lines respectively associated with the rows of said memory cells and selectively driven to an active level for selecting one of the rows of said memory cells,
   c) a plurality of read-out data paths respectively connectable with said one of the rows of said memory cells for propagating said data bits read out therefrom,
   d) a plurality of circuits respectively coupled to said plurality of read-out data paths and responsive to said data bits on said associated plurality of read-out data paths,
   e) a switching circuit responsive to a control signal for coupling said plurality of read-out data paths to a source of constant voltage level indicative of a logic level, and
   f) a row address decoder unit having first output nodes respectively coupled to said plurality of word lines and at least one second output node coupled to said switching circuit, without any electrical connection to one of said plurality of word lines, and responsive to a row address signal for selectively driving said first output nodes and said at least one second output node to active level depending upon a row address indicated by said row address signal, said control signal allowing said switching circuit to couple said source of constant voltage level to said read-out data paths when said row address signal is indicative of said at least one second output node, said switching circuit electrically isolating said read-out data paths from said source of constant voltage level when said row address signal is indicative of one of said word lines.

2. A semiconductor memory device as set forth in claim 1, in which said semiconductor memory device further comprises charging means operative to charge said plurality of read-out data paths to an intermediate level before said plurality of read-out data paths are connected to said one of the rows of said memory cells.

3. A semiconductor memory device as set forth in claim 1, in which each of said memory cells comprises two inverting circuits each having an input node coupled to an output of the other.

4. A semiconductor memory device as set forth in claim 3, in which each of said read-out data paths is implemented by a single read-out data line.

5. A semiconductor memory device as set forth in claim 4, in which said switching circuit comprises a plurality of switching transistors each coupled between said source of constant voltage level and said read-out data line.

6. A semiconductor memory device as set forth in claim 1, in which said row address decoder unit has a plurality of second output nodes coupled to an OR gate, said switching circuit being controlled by said OR gate.

7. A semiconductor memory device as set forth in claim 6, in which said switching circuit comprises a plurality of switching transistors each coupled between said source of constant voltage level and said read-out data paths and gated by said OR gate.

8. A semiconductor memory device comprising
   a) a plurality of memory cells arranged in rows and columns and storing data bits,
   b) a plurality of word lines associated with the rows of said memory cells, respectively, and selectively driven to an active level by a row address decoder unit for selecting one of the rows of said memory cells,
   c) a plurality of read-out data paths respectively connectable with said one of the rows of said memory cells for propagating said data bits read out therefrom,
   d) a column selecting unit responsive to a column selecting signal for coupling one of said plurality of read-out data paths to an output data path, an output circuit being responsive to an output data on said output data path,
   e) a switching circuit responsive to a control signal for coupling said output data path to a source of constant voltage level indicative of a logic level, and f) a column address decoder unit responsive to a column address signal for selectively producing said column selecting signal and said control signal depending upon a column address indicated by said column address signal, said column address decoder unit having first output nodes coupled to said column selecting unit for supplying said column selecting signal, and at least one second output node coupled to said switching circuit without any electrical connection to said column selecting unit for supplying said control signal to said switching circuit, said control signal allowing said switching circuit to couple said read-out data paths with said source of constant voltage level when said column address signal is indicative of said second output node, said switching circuit electrically isolating said read-out data paths from said source of constant voltage level when sale column address is indicative of one of said first output nodes.

9. A semiconductor memory device as set forth in claim 8, in which each of said memory cells comprises two inverting circuits each having an input node coupled to an output of the other.

10. A semiconductor memory device as set forth in claim 9, in which each of said read-out data paths is implemented by a single read-out data line.

11. A semiconductor memory device as set forth in claim 10, in which said switching circuit comprises a switching transistor coupled between said source of constant voltage level and said output data path.

* * * * *